(12) United States Patent
Basu et al.

(10) Patent No.: US 10,215,814 B2
(45) Date of Patent: Feb. 26, 2019

(54) SYSTEM AND METHOD FOR COGNITIVE ALARM MANAGEMENT FOR THE POWER GRID

(71) Applicant: International Business Machines Corporation, Armonk, NY (US)

(72) Inventors: Chumki Basu, Bangalore (IN); Kaushik Das, Roskilde (DK); Jagabondhu Hazra, Bangalore (IN); Devasenapathi P. Seetharamakrishnan, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 922 days.

(21) Appl. No.: 14/015,426

(22) Filed: Aug. 30, 2013

(65) Prior Publication Data

US 2015/0066435 A1    Mar. 5, 2015

(51) Int. Cl.
*G01R 31/40* (2014.01)
*H02H 1/00* (2006.01)
*G01R 31/08* (2006.01)
*G01R 19/25* (2006.01)
*H04Q 9/00* (2006.01)

(52) U.S. Cl.
CPC ......... *G01R 31/40* (2013.01); *G01R 19/2513* (2013.01); *G01R 31/086* (2013.01);
(Continued)

(58) Field of Classification Search
None
See application file for complete search history.

(56) References Cited

U.S. PATENT DOCUMENTS 5,163,151 A    11/1992    Bronikowski et al.
5,625,751 A     4/1997    Brandwajn et al.
(Continued)

FOREIGN PATENT DOCUMENTS

EP      2033060 B1    4/2013
WO    WO9966471 A1   12/1999
(Continued)

OTHER PUBLICATIONS

Larsson et al., "Real-Time Root Cause Analysis for Complex Technical Systems" Joint 8th IEEE HFPP / 13th HPRCT, 2007.*
(Continued)

*Primary Examiner* — John Kuan
(74) *Attorney, Agent, or Firm* — Ference & Associates LLC

(57) ABSTRACT

Systems and methods for cognitive alarm management in a power grid are described. In one embodiment, sensor measurements are transformed to determine the state of a power grid. Given current state information relating to the power grid, various analyses of the alarms may be conducted to produce various rankings of the alarms (e.g., by severity, graph analyses, etc.). In an embodiment, using power flow analysis, an optimal ranking is identified from the rankings in which a causal alarm is prioritized for resolution. Given the resolution of the causal alarm, remaining alarms (either all or a sub-set) may be resolved without further action. Thus, an embodiment provides an appropriate ranking of alarm conditions in a power grid such that the optimal resolution of alarms may be achieved. Other variants and embodiments are broadly contemplated herein.

20 Claims, 4 Drawing Sheets

(52) U.S. Cl.
CPC ............ *H02H 1/0092* (2013.01); *H04Q 9/00* (2013.01); *H04Q 2209/60* (2013.01); *H04Q 2209/823* (2013.01); *Y04S 10/522* (2013.01)

(56) References Cited

U.S. PATENT DOCUMENTS

| | | | |
|---|---|---|---|
| 7,961,087 B2 | 6/2011 | Hoveida | |
| 8,239,070 B1* | 8/2012 | Schlueter | H02J 3/00 700/286 |
| 2011/0282508 A1* | 11/2011 | Goutard | H04L 63/20 700/293 |
| 2013/0063272 A1 | 3/2013 | Bhageria et al. | |
| 2013/0232094 A1* | 9/2013 | Anderson | G05B 23/0229 706/12 |

FOREIGN PATENT DOCUMENTS

| | | |
|---|---|---|
| WO | WO2005081134 A1 | 9/2005 |
| WO | WO2006101472 A1 | 9/2006 |

OTHER PUBLICATIONS

Emerson Process Management, "Ovation Alarm Management System," Data Sheet, 5 pages, Emerson Process Management Power & Water Solutions, Pittsburgh Pennsylvania, USA. Accessed Aug. 28, 2013 at http://www2.emersonprocess.com/siteadmincenter/PM%20Power%20and%20Water%20Documents/pws_001548.pdf.

Aizpurua, O. et al., "A New Cognitive-Based Massive Alarm Management System in Electrical Power Administration," Proceedings of the 7th International Caribbean Conference on Devices, Circuits and Systems, Cancun, Mexico, Apr. 28-30, 2008, 6 pages, IEEE Xplore Digital Library.

O'Brien, Larry et al.,"Alarm Management Strategies," ARC Strategies, Nov. 2004, pp. 1-24, ARC Advisory Group, Dedham, Massachusetts, USA.

Beuthel, Carsten M. et al., "Alarm Management for Power Generation," White Paper, 2012, pp. 1-8, ABB, Baden-Württemberg, Germany.

* cited by examiner

SYSTEM AND METHOD FOR COGNITIVE ALARM MANAGEMENT FOR THE POWER GRID

BACKGROUND

With wide area situational awareness, power grid operators are overwhelmed by an increasing number of data signals and measurements at any given time. Some estimates for the maximum number of alarms, which could be triggered for different types of events, include up to 150 alarms for a transformer fault, up to 2000 alarms for a generation substation fault, up to 20 alarms per second during a thunderstorm, and up to 15,000 alarms for each regional center during the first 5 seconds of a complete system collapse.

Servicing these alarms brings the power grid back to a normal and secure state. While there are a variety of ways in which alarms might handled, it is not readily apparent which resolution plan for the alarms would lead to the resolution of the problem(s) (i.e., bringing the power grid back to a normal and secure state) most efficiently. Moreover, the sheer amount of alarms proves challenging for operators and analysis systems. Frequently, the volume of alarms is such that there is no convenient way to establish which alarm should be handled in which order, or why.

BRIEF SUMMARY

In summary, one aspect of the method provides a method of cognitive alarm management, said method comprising: utilizing at least one processor to execute computer code configured to perform the steps of: receiving, from a plurality of sensors of a power grid, a plurality of sensor measurements; transforming the plurality of sensor measurements into a state estimation of the power grid, the state estimation of the power grid including two or more alarms; determining rankings of the two or more alarms; simulating power flow resulting from resolution of the two or more alarms in rank-order, according to the rankings of the two or more alarms; and determining a final ranking of the two or more alarms based on said simulating; wherein the final ranking of the two or more alarms identifies a causal alarm to be prioritized for resolution.

Another aspect of the invention provides a computer program product for cognitive alarm management, said computer program product comprising: a computer readable storage medium having computer readable program code embodied therewith, the computer readable program code comprising: computer readable program code configured to receive, from a plurality of sensors of a power grid, a plurality of sensor measurements; computer readable program code configured to transform the plurality of sensor measurements into a state estimation of the power grid, the state estimation of the power grid including two or more alarms; computer readable program code configured to determine rankings of the two or more alarms; computer readable program code configured to simulate power flow resulting from resolution of the two or more alarms in rank-order according to the rankings of the two or more alarms; and computer readable program code configured to determine a final ranking of the two or more alarms based on the simulating; wherein the final ranking of the two or more alarms identifies a causal alarm to be prioritized for resolution.

A further aspect of the invention provides an apparatus for cognitive alarm management, said apparatus comprising: at least one processor; and a computer readable storage medium having computer readable program code embodied therewith and executable by the at least one processor, the computer readable program code comprising: computer readable program code configured to receive, from a plurality of sensors of a power grid, a plurality of sensor measurements; computer readable program code configured to transform the plurality of sensor measurements into a state estimation of the power grid, the state estimation of the power grid including two or more alarms; computer readable program code configured to determine rankings of the two or more alarms; computer readable program code configured to simulate power flow resulting from resolution of the two or more alarms in rank-order according to the rankings of the two or more alarms; and computer readable program code configured to determine a final ranking of the two or more alarms based on the simulating; wherein the final ranking of the two or more alarms identifies a causal alarm to be prioritized for resolution.

An additional aspect of the invention provides a method comprising: receiving a plurality of power grid sensor measurements; transforming the power grid sensor measurements into an estimation of two or more alarms; classifying the two or more alarms based on at least one of severity index calculations and graph analysis; conducting a simulation relating to resolution of the two or more alarms, based on classifying the two or more alarms; and thereupon identifying a causal alarm to be prioritized for resolution.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

Figure 1:
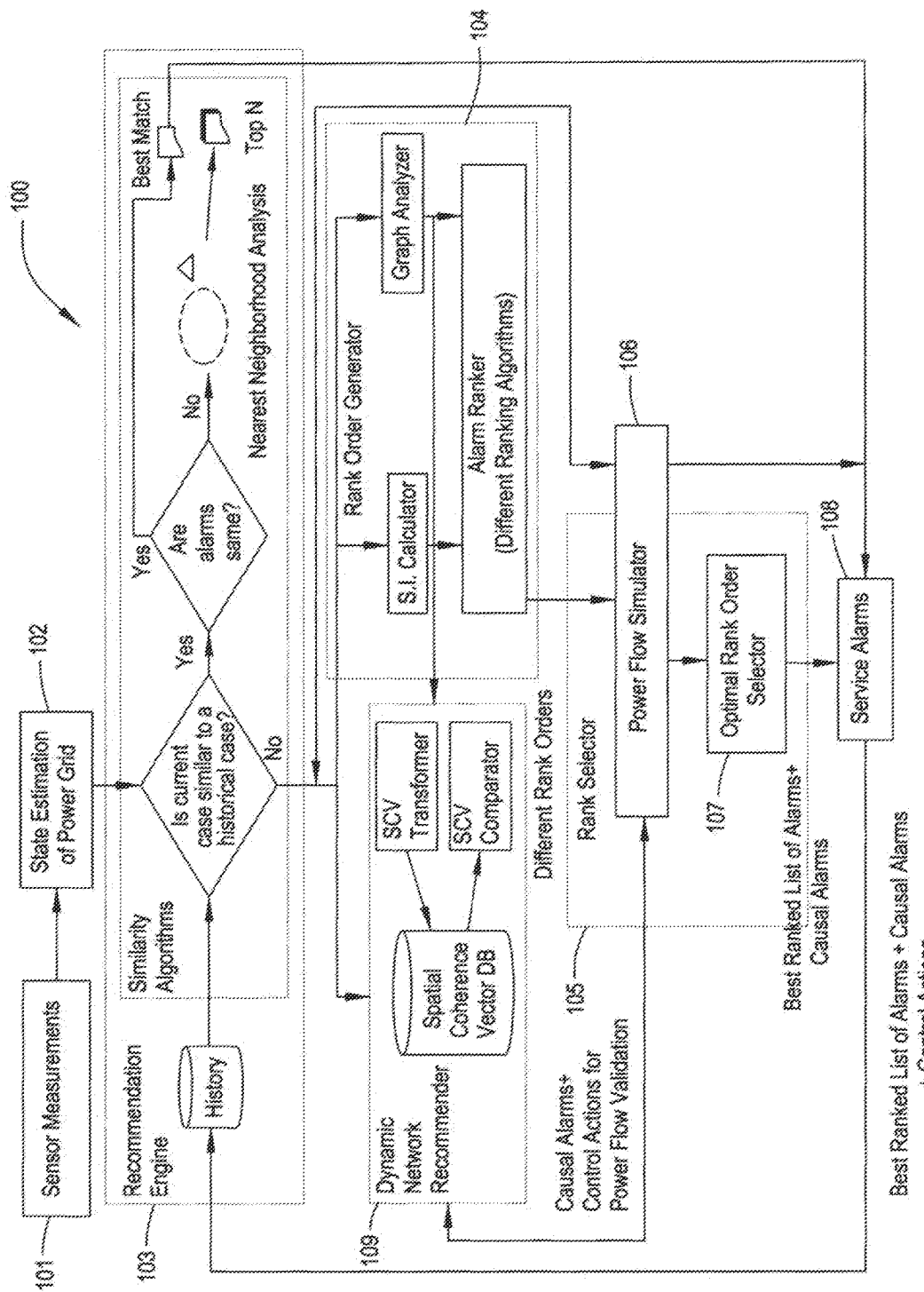
FIG. 1 illustrates an example system architecture and flow for cognitive alarm management in a power grid.

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The description now turns to the figures. The illustrated embodiments of the invention will be best understood by reference to the figures. The following description is intended only by way of example and simply illustrates certain selected exemplary embodiments of the invention as claimed herein.

It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Specific reference will now be made herebelow to FIGS. 1-3. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12 in FIG. 4. In accordance with an example embodiment, most if not all of the process steps, components and outputs discussed with respect to FIGS. 1-3 can be performed or utilized by way of a processing unit or units and system memory such as those indicated, respectively, at 16 and 28 in FIG. 4, whether on a server computer, a client computer, a node computer in a distributed network, or any combination thereof.

In FIG. 1 an overview of a system and method for cognitive alarm management is illustrated. In the system 100 according to one example embodiment, sensor measurements 101 (e.g., voltage measurements, current measurements) are received and used to estimate the state of the power grid 102.

Figure 2:
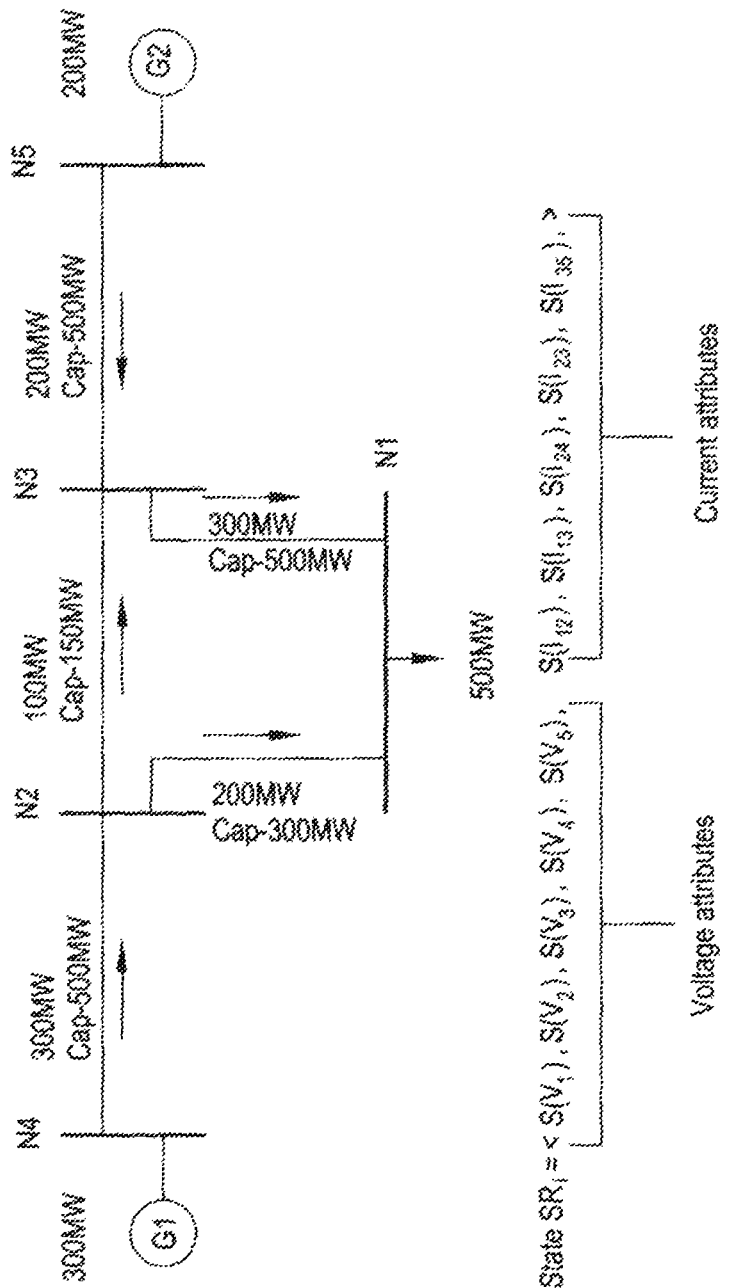
FIG. 2 illustrates an example state representation of a portion of a power grid.

An example of state estimation is illustrated in FIG. 2. As shown (referring to FIGS. 1 and 2 collectively), the sensor measurements 101 may be mapped or transformed into state levels that are in turn utilized to create a state representation, $SR_i$ of FIG. 2. The sensor measurements 101 (e.g., exact current and/or voltage measurements) may be mapped into state levels (e.g., 1, 2, 3 . . . ) to conveniently categorize the sensor measurements 101 as alarm conditions (e.g., under-voltage, over-voltage, overload, under-frequency, over-frequency, etc.) such that the number of values to be handled is reduced. The state levels may correspond to zones, e.g., state level 1 is preferred zone, state level 2 is vulnerable zone, state level 3 is dangerous zone, and the like. An embodiment may then utilize raw sensor measurements 101 to estimate the state of the power grid by determining which state level the sensor measurements 101 indicate and utilize this information to create a snap shot for the state of the power grid.

Figure 3:
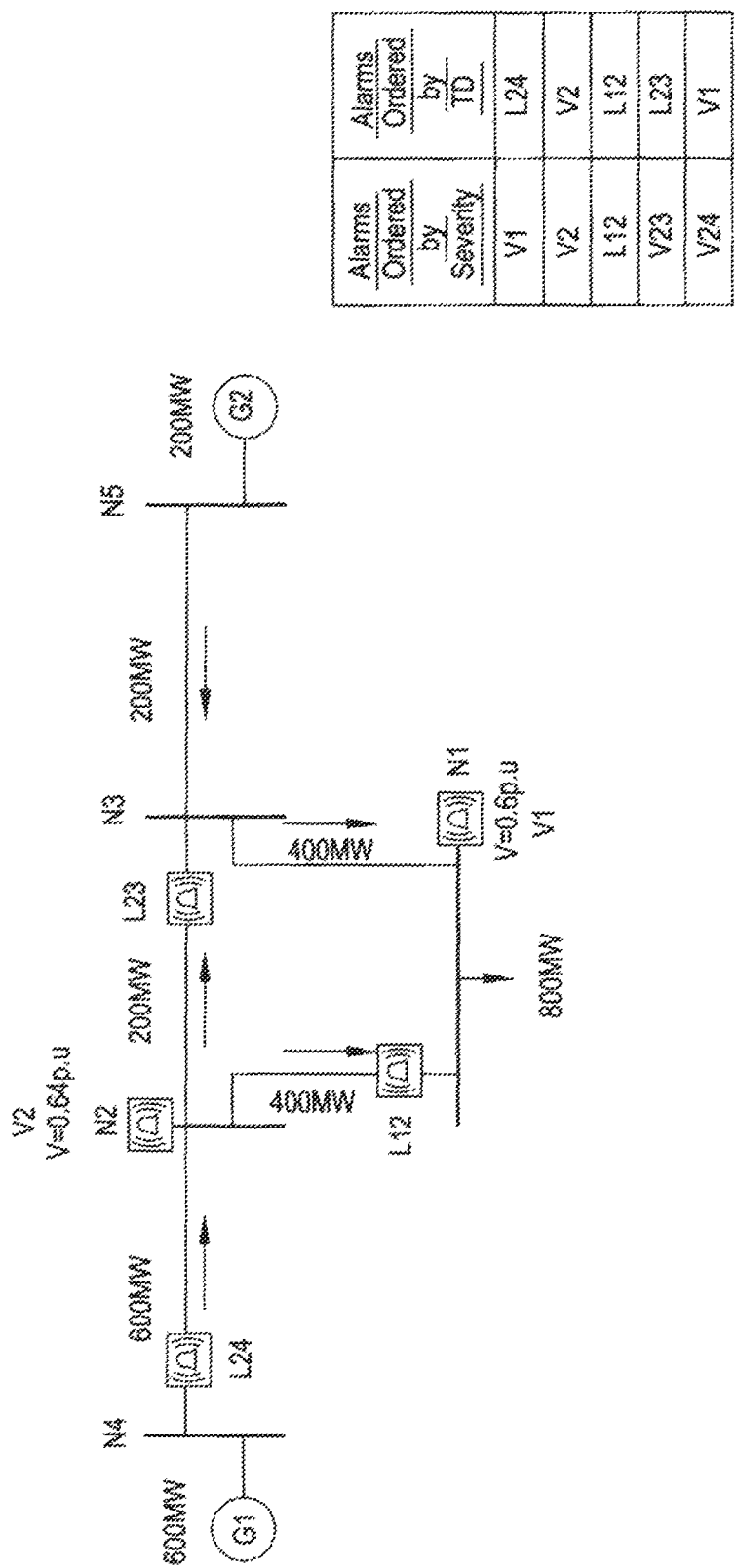
FIG. 3 illustrates an example portion of a power gird, alarms associated therewith, and rankings of the alarms.

Accordingly, referring to FIG. 3, a change in system state, e.g., a load increase from 500 MW to 800 MW may lead to 5 alarms being detected via sensor measurements 101 received by the system 100. In the example grid topology of FIGS. 2-3, the five alarms include L24 (line between nodes N2 and N4), L12 (line between nodes N1 and N2), L23 (line between nodes N2 and N3), V2 (alarm at node N2) and V1 (alarm at node N1).

Referring back to FIG. 1, given sensor measurements 101 and estimation of the state of the power grid under a current condition (e.g., such as outlined in FIG. 3 with a load increase leading to five alarms), an embodiment employs a recommendation engine 103 for handling the alarms. The recommendation engine may take a variety of actions depending at least in part on the inputs provided (i.e., sensor measurements 101 available) and/or the historical or comparison data available (e.g., history information within the recommendation or similarity data accessible to the recommendation engine 101, such as stored in a dynamic network recommender 109, described in detail elsewhere herein).

In the case where a current collection of alarms, e.g., L24, L12, L23, V2 and V1 of FIG. 3, a straight-forward case may exist where an exact match may be found such that a prior successful resolution of the alarms may be undertaken to service the alarms 108 without further analysis. Thus, it may occur by chance that a specific alarm condition is repeated exactly such that the ordering of alarms for resolution amounts to a straight-forward matching problem, which is handled easily enough.

A direct match may be found where two cases, C1 (current case) and C2 (historical case), are the same. In terms of "sameness", an embodiment may utilize relevant criterion such as grid topology (i.e., the same node or line is associated with an alarm) and alarm list, $SR_{input}$, are the same.

In practice, this rarely happens. Thus, no exact comparison will be available to reference for the specific alarm condition at hand and therefore specific control actions, and orderings thereof, are not available. Accordingly, a problem arises in that the system operator (or system, if automated alarm resolution is implemented) must decide which alarm is to be resolved first, which is to be resolved second, and so forth in order to adequately handle the alarm condition in the most efficient manner.

Compounding the alarm management problem is that many ranking algorithms utilized for ranking alarms will not lead to an optimal resolution of the alarms. For example, given the alarm conditions of FIG. 3, a ranking based on severity leads to an alarm ranking of V1, V2, L12, V23, and V24, with V1 being the highest ranked or priority alarm based on severity. By way of illustrative example, the severity of an alarm may be determined according to its severity index ("SI") as follows. For voltage, assuming a nominal voltage (Vn) of 1, the nominal voltage of "V1" (i.e., the voltage at node N1 of FIG. 3) leads to V1=Vn=1 p.u. If the measured voltage (Vm) of V1 is actually 0.6 p.u. (i.e., V1=Vm=0.6 p.u.), then the severity index (S.I.) of V1 is as follows: $S.I.=(Vn-Vm)^2$, and in this example works out to $(1-0.6)^2=0.16$. Other severity index calculations may be utilized, as will be understood by those having ordinary skill in the art.

Thus, using a severity index calculation to rank order the alarms as V1, V2, L12, L23, and L24 leads to the conclusion that alarm V1 should be resolved first, as its alarm condition is most severe (i.e., voltage V1 is the most severe alarm condition according to the metric(s) utilized to rank based on severity). However, in practice it turns out that resolving alarm V1 (i.e., returning node N1 to a non-alarm condition voltage) does not resolve all alarms, but requires thereafter resolving alarm V2 and alarm L12, at which point the remaining alarms (L23 and L24) are automatically resolved (i.e., alarms L23 and L24 were dependent on alarms V1, V2 and V12). However, this is not optimal in as much as there is another way to rank the alarms that, if the alarms are resolved according to the alternative ranking, leads to a need only to resolve alarm L24, at which point the remaining alarms resolve automatically. Therefore, what is needed is a way to find the optimal ranking of alarms such that the least number of alarms need to be resolved to return the power grid to a normal, secure state.

Short of an exact match (referenced briefly above), another case scenario is that there exists a historical match that while not exact, is similar enough to infer that a similar solution (i.e., a rank ordering of alarms to be handled) is appropriate for immediate implementation or appropriate for further analysis, e.g., power flow simulation, as further described herein. Thus, the recommendation engine 103 may access a history of prior alarm conditions and control actions used to resolve the same in order to determine if there exists historical case(s) that may be used to rank-order the alarms for resolution. Finding similar historical match may be accomplished in a variety of ways, examples of which are described herein.

In an example, the recommendation engine 103 may attempt a similarity analysis in order to identify like situations in a historical database. Thus, the recommendation engine may attempt to identify similar historical conditions using one or more of similarity of grid topology (e.g., alarm within a local zone of node N2) and system state attribute(s) (e.g., system state values that have similar state vectors, e.g., within a predetermined threshold). For grid topology similarity, an embodiment may determine, e.g., if there is a current alarm at node N2 as indicated by sensor measurements 101, if there is a historical alarm condition with similarity, for example an alarm at N2 (e.g., in the case of an exact match) or within a local zone of node N2 (e.g., within 5 hops of node N2). In terms of determining similarity between system states, an embodiment may look for matches using a direct method (e.g., Euclidean distance) or transformation-based methods (e.g., edit distance and/or graph edit distance) to compute a similarity of the state vectors for the two cases (i.e., the current system state and the historical system state).

Thus, if there is not an exact match but nonetheless there is a similar historical case, an embodiment may evaluate the historical case(s) in order to determine if the historical case(s) suggest an alarm ranking that may be utilized. For example, the recommendation engine 103 may perform a nearest neighbor analysis in order to identify historical case(s) that may be utilized to make an alarm ranking recommendation for resolution of the current power grid problem (alarm list), an example of which is provided herein.

For k-nearest neighbor cases, an embodiment returns causal alarm(s) (e.g., top n highest priority alarms that, if resolved first, automatically resolve other alarms) and associated control actions for those cases with similar outcomes. The similarity of outcomes for the k-nearest neighbor cases may be found in a variety of ways, including for example thresholding the outcomes against a similarity metric, as follows:

For outcome C1 and C2, since a case is not a flat feature vector in that it has a hierarchical structure where feature values reference non-atomic objects (F1), similarity may be defined as:

Similarity of (F1(C1), F1(C2))≥0.90; and
Similarity of (F2(C1), F2(C2))≥0.90;

where $F1=SR_{input}$ (state representation input, e.g., voltage and current variables) and F2 =grid topology (GT). Similarity also may be defined as:

Similarity of (F1(C1), F1(C2))≥0.90; and
Similarity of (F2(C1), F2(C2))≥0.90; and
Semantic Similarity of (F3(C1), F3(C2))≥0.90;

where $F1=SR_{output}$ (state representation output, e.g., voltage and current variables), F2 represents the causal alarm(s), and F3 represents the control action(s). Semantic similarity of control actions may be regarded as a similarity metric based on similarity of concepts (in a concept hierarchy) relating the control actions. For example, for control actions sharing the same hypernym in a concept hierarchy, the control actions may be said to be "similar" in that they are semantically similar. Thus, one control action may be substituted for another.

Accordingly, the recommendation engine 103 may perform a variety of similarity analyses in order to identify similar historical case(s) that may be utilized to infer appropriate control actions to perform and the ordering thereof, influencing or producing alarm ranking(s) for the current alarm list, i.e., derived from sensor inputs 101. If a nearest neighbor analysis returns alarms of similar historical cases, a recommendation as to causal alarms and associated control actions for resolving the current case may be made. Additionally or alternatively, a top n list of alarms generated by the nearest neighbors may be submitted for power flow simulation and validation, as further described herein. Otherwise, the recommendation engine 103 may return a union of all alarms associated with control actions for the k-nearest neighbor cases.

Thus, in performing a similarity analysis, an embodiment may provide a best match historical case, e.g., when the alarms of the historical case are the same as the alarms of the current case. If the alarms are different, the recommendation engine 103 may provide a "top-n" recommendations based on a nearest neighbors analysis, where a list of alarms is analyzed to determine which, if any, alarm may be a causal alarm. A causal alarm is a high impact alarm, the resolution of which causes one or more other alarms to be resolved without further action, as further described herein. Thus, an embodiment will generate a rank-ordering of alarms in the current list of alarms and seek to identify a causal alarm, e.g., using power flow analysis, as further described herein.

In the event that the historical cases do not lead to a proposed ranking of alarms, or in addition to such rankings, an embodiment may rank order the alarms using a rank order generator 104 according to a variety of methods. This may include ranking the alarms according to their severity index and/or utilizing a graph analyzer to rank the alarms detected in the sensor measurements 101. A severity index, as described herein, may be utilized to calculate the severity of all alarms and nodes (equipment of the grid) indicated by the sensor measurements 101. This ranks the alarms in terms of severity. A graph analyzer may be utilized to construct an alarm relationship graph that may in turn be used to compute relationship metrics, e.g., centrality measures such as the degree of closeness, betweenness and the like, in order to analyze interrelated nodes and alarm conditions. The graph analyzer applies Web analytics on the grid connectivity information as well as other associations between assets on the power system network.

For example, an embodiment may employ an alarm relationship graph. An alarm relationship graph represents the dynamic relationships between alarms, not a relationship established by predefined rules. An embodiment may model the number and type of relationships between alarms in a connectivity or alarm relationship graph. The type of relationships may include spatial, temporal, etc. An embodiment may employ graph analysis techniques to capture special kinds of dependencies between alarms that are not reflected, e.g., in severity indices. For example, applying centrality and closeness principles from social network analysis (which can be considered as a sub-discipline of Web analytics) an embodiment may find interesting properties of alarm graph and base the rank ordering of alarms on these relationship(s). Such an approach is extensible and may be modified dynamically to introduce and/or remove relations by adding and/or deleting links between graph nodes without re-engineering of predefined rules being required.

As an example, let $G=\{N_1, N_2, N_3, \ldots, N_k\}$ represent a power grid that contains K nodes, $N_i$. Each node, $N_i$, has M sensors, $S_1, S_2, \ldots, S_M$. For a given node $N_1$, an alarm $A_1$ is generated from the measurement from sensor $S_1$, which could cause an event, $A_2$. An embodiment may then compute individual severity measures for each alarm, $A_i$, and for each node, $N_i$, compute severity indices, $SI_{Ni,A}$ corresponding to the alarms.

Severity may be computed in a variety of ways. For example, the rank order generator 104 may compute individual severity measures using graph distance, percentage of occurrences in the graph, rate of change of distance within the graph, probability of an alarm, $A_2$, given that it is known that alarm, $A_1$, has occurred, the critical distance in the graph, the weather conditions related to the grid topology (e.g., node or line producing the alarm), etc. For each node, the rank order generator 104 may compute the severity indices corresponding to the alarms using, e.g., the severity index of an alarm, $A_1$, and the severity index of a node, $N_1$, corresponding to an alarm, $A_1$, where weight may be a function of topological distance in the grid (e.g., from $N_i$ from $N_1$).

Thus, in an embodiment, the rank order generator 104 may define an alarm relationship graph that represents alarms as nodes in the graph where relations are represented as links between the nodes of the graph. Logical connections between two nodes may be provided as links, where the links may be directed or undirected.

Links of the graph may be basic links. Basic links represent simple relationships and have no other properties other than link type and direction. Based on link type, links may be symmetric or asymmetric. Links of the graph may be symmetric, such as having linked alarms (logically) balanced (A←→B). Links may be undirected links, e.g., A is topologically adjacent to B. The links may be asymmetric, e.g., linked alarms are not balanced (A→B). The asymmetric links may include directed links, e.g., A happens before B, B is associated with a more significant load (e.g., generator) than A, and B is less costly to service than A.

Benefits of using this logical connectivity model include the ability to apply knowledge discovery methods such as network analysis to the alarm ranking problem. Therefore, using principles of social network analysis, the rank order generator 104 may find interesting properties of nodes (e.g., alarms) by computing centrality measures such as degree centrality, closeness centrality, and betweenness centrality.

In addition to ranking alarms based on severity, the rank order generator 104 may rank alarms based on graph analysis, examples of which include the following. In order to rank based on the degree of centrality, the rank order generator 104 constructs an alarm relationship graph enumerating all relations between alarms, A and B, on the grid. Symmetric and asymmetric links may then be added. Using degree centrality, the more paths between any two alarms, the stronger their relationship. In terms of a ranking algorithm based on degree centrality, the rank order generator 104 may compute an adjacency matrix and out- and in-degree of each node in the graph and assign these to each alarm (node in this case) in the graph. The alarms may then be ordered, e.g., in decreasing order by degree, with unconnected nodes included at the end of the alarm list, e.g., ordered according to another metric (e.g., degree of severity).

The rank order generator 104 may also rank the alarms based on out/in-degree centrality. For example, rather than assigning a degree to each alarm in the list, an embodiment may assign out-degree to each alarm in the list and, rather than ordering alarms in decreasing order by degree, an embodiment may order alarms in decreasing order by out-degree, e.g., with alarms with higher severity ranked higher and unconnected nodes ranked, e.g., according to severity. Additionally, the rank order generator 104 may also rank the alarms based on in-degree metrics, e.g., assign in-degree to each alarm in the list and order the alarms by decreasing order of in-degree, e.g., with alarms with higher severity ranked higher and unconnected nodes ranked, e.g., according to severity.

The rank order generator 104 may also rank the alarms based on closeness centrality. For example, as the distance between two alarms increases, the strength of the relationship (between the alarms) decreases. Accordingly, the rank order generator 104 may use the inverse sum of the shortest path distances between each alarm and every other alarm in the network to rank the alarms, as follows. An embodiment may compute a shortest paths distance matrix, compute the sum of the shortest paths to all nodes, S, and compute the closeness centrality rank as 1/S. A closeness rank may then be assigned to each alarm (node) in the alarm list. The alarms may then be ordered by closeness rank, e.g., with higher severity alarms ranked higher and with unconnected nodes ranked (e.g., according to severity).

Additionally, in an embodiment, the rank order generator 104 may use a composite alarm ranking scheme, as follows. Let A be a set of n alarms such that $A=\{A_1, A_2, \ldots, A_n\}$ and let $R=\{r_1, r_2, \ldots, r_m\}$ be a set of R rankers. A function C: A→poset(R) states that the domain of C is the set of all alarms and the range is the set of all possible partial orderings (posets). Therefore, $C(r_i)$ represents ranker $r_i$'s ordering of the alarms. A composite ranking mechanism, e.g., Borda Count (voting method), may be employed, as follows.

Let C(r) be a linear ordering of the alarms in A. Let $a_i$ be the $i^{th}$ most severe alarm in the ordering C(r). In a first step, the rank order generator 104 computes the Borda Score of $a_i$, in C(r) as:

$$B_{a_i}(r)=n-i$$

Then, the rank order generator 104 computes the total Borda Score for alarm $a_i$ across all orderings as:

$$\sum_{j=1}^{m} B_{a_i}(r_j)$$

The rank order generator 104 computes the winning Borda Score, a' using:

$$\sum_{j=1}^{m} B_{a'}(r_j) > \sum_{j=1}^{m} B_a(r_j)$$

Alternatively, the rank order generator 104 may use an composite rank ordering mechanism such as, for each alarm, ai, compute the average of the scores across all ranking mechanisms using:

$$\sum_{j=1}^{m} S_{a_i}(r_j)/j$$

Once the rank order generator 104 has created the various alarm rankings, e.g., using a suitable combination of the foregoing and/or other alarm ranking methods, the alarm rankings may or may not represent the optimal alarm resolution ordering, as described herein.

Accordingly, referring back to FIG. 1, the alarm rankings produced by the rank order generator 104 are utilized by a rank selector 105 to select the optimal ranking of alarms. In an embodiment, the alarm rankings are used for power flow simulations in order to determine which of the alarm rankings is the optimal ranking for the current case.

For power flow simulation, referring to FIG. 3, it has been described herein that a given ranking (e.g., based on severity) may not provide an optimal ranking of alarms. As described in connection with FIG. 3, using the example severity ranking (referenced to nominal voltage) produces the ranking V1, V2, L12, L23, and L24, but requires resolution of three alarms, i.e., V1, V2 and L12, prior to the problem being resolved (i.e., resolution of all alarms). Thus, while this severity ranking is useful inasmuch as it resolves alarms L23 and L24 automatically, it is not optimal, as described further herein.

Taking the example of FIG. 3, had the alarms been ranked by topological distance (from G1, a generator), the ranking would be L24, V2, L12, L23 and V1, as illustrated. It turns out, e.g., as confirmed by power flow simulation, resolving alarm L24 automatically resolves all other alarms, i.e., alarms V2, L12, L23 and V1 resolve themselves after alarm L24 is resolved. Thus, a ranking based on topology, rather than severity, is the optimal ranking of alarms. Power flow simulation (i.e., simulating grid behavior given implementing certain control actions, e.g., to resolve a particular alarm) may be used to analyze the various alarm rankings to identify or determine an optimal alarm ranking.

In order to assist in identification of the optimal ranking of alarms, an embodiment undertakes a variety of approaches, via rank order generator 104, to provide a plurality of alarm rankings. Absent an exact match, this assists in identification of the optimal ordering or alarm rankings, e.g., via power flow simulation, without overly taxing the system 100 with generation of many alarm rankings. Accordingly, by intelligently producing a plurality of alarm rankings, e.g., based on severity, similarity metrics, graph analysis, etc., an embodiment provides a plurality of rankings that may be used to simulate problem resolution orderings, e.g., using power flow simulation, such that an optimal alarm ordering (and consequent alarm resolution ordering) may be identified automatically.

Therefore, given a plurality of alarm rankings, an embodiment utilizes a power flow analyzer 105, as part of the rank selector 105, to simulate the resolution of alarms according to their rank orderings in the rankings. By doing such power flow simulations, an embodiment is able to quickly identify an optimal solution, i.e., the optimal ordering or alarms in a set of rankings, including the identification of high impact or causal alarms, i.e., those alarms, the resolution of which, leads to resolution of one or more other alarms without additional control actions.

The optimal rank order selector 107 takes output of the power flow simulator 106 and selects the optimal rank ordering of alarms to be serviced 108 via control action(s). The optimal rank order selector 107 therefore outputs the best ranked list of alarms and causal alarm(s) such that servicing of alarms 108 may be accomplished in the most efficient manner. This optimal ranking of alarms may be stored in a historical database, reference above, for future use (i.e., in finding similar historical cases in the next round of alarm analysis).

Additionally, an embodiment may provide a dynamic network recommender 109. This may accept as input the output of the optimal rank order selector 107 and/or other inputs, e.g., from connected systems or devices.

The dynamic network recommender 109 may be utilized in a similarity analysis, in addition to or as an alternative to the similarity analyses mentioned heretofore. In order to capture dynamic characteristics of the power grid network that are computed during each execution of the ranking, an embodiment may employ the dynamic network recommender 109 to secure supplemental information. For example, the following information may be stored following the ranking of alarms as described herein: severity indices assigned to alarms, topology distance values, logical alarm relationships (from graph analysis), etc. At any given time, $t_i$, an embodiment may create a snapshot or "image" of an augmented network and apply techniques derived from content-based image retrieval to do situational "reconnaissance", e.g., similarity calculations.

In its simplest form, an embodiment augments the physical network with sensory inputs. Furthermore, dynamically computed features are not independent of the physical topology of the network and other spatial relationships. An embodiment adds features associated with each location (node) on the network (e.g., alarm severity, topology distance, relationships, etc.), as follows.

In an embodiment, the dynamic network recommender defines a transformation function, e.g., using spatial coherence vectors (SCV). Using the network data, "image date", an embodiment summarizes the image in a histogram and refines the histogram representation such that histogram buckets are partitioned based on spatial coherence (analogous to "color coherence vector"). Each extracted feature is associated with a coherent, localized region of the network. An embodiment may therefore compare SCVs for similarity comparisons, e.g., using distance measurements. On the basis of such comparison(s), the dynamic network recommender 109 may recommend associated alarms and control actions by finding the best matches and recommending causal alarms and control actions for power flow validation on the basis of this similarity matching, e.g., by power flow simulator 106. Thus, an embodiment may provide an additional mechanism by which similarity calculations may be conducted, e.g., using network "image" comparisons, to provide alarm rankings, e.g., for use or validation.

Thus, an embodiment provides mechanisms to take sensor measurements, transform these into state representations for the power grid, generate candidate alarm rankings, analyze these candidate alarm rankings (e.g., using power flow simulation), and supply the optimal alarm ranking (e.g., for most efficient problem resolution) as output.

In brief recapitulation, it can be appreciated from the foregoing that, generally, a notion of generating multiple rank orders of items (in this case, alarms on the grid) and determining an optimal one is derived from Web analytics. A significant feature, as broadly contemplated herein in accordance with at least one embodiment of the invention, can be found both in the application of Web analytics to the alarm management problem and in the use of power flow simulation to identify causal alarms, which are used to determine an optimal ordering.

Figure 4:
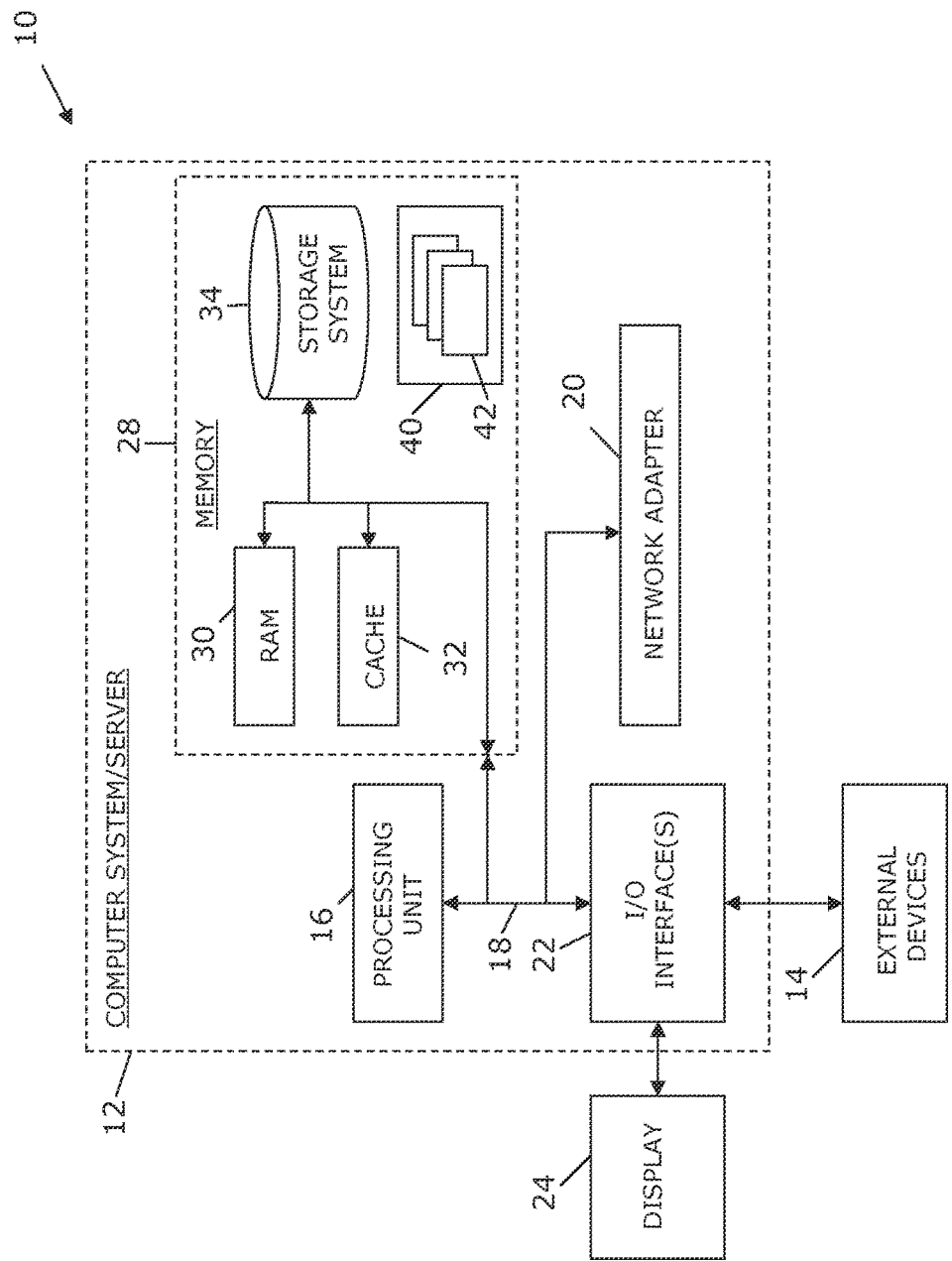
FIG. 4 illustrates an example computing node.

Referring now to FIG. 4, a schematic of an example of a computing node is shown. Computing node 10 is only one example of a suitable cloud computing node and is not intended to suggest any limitation as to the scope of use or functionality of embodiments of the invention described herein. Regardless, computing node 10 is capable of being implemented and/or performing any of the functionality set forth hereinabove. In accordance with embodiments of the invention, computing node 10 may not necessarily even be part of a cloud network but instead could be part of another type of distributed or other network, or could represent a stand-alone node. For the purposes of discussion and illustration, however, node 10 is variously referred to herein as a "cloud computing node".

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, computer system/server 12 in computing node 10 is shown in the form of a general-purpose computing device. The components of computer system/server 12 may include, but are not limited to, at least one processor or processing unit 16, a system memory 28, and a bus 18 that couples various system components including system memory 28 to processor 16.

Bus 18 represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that are accessible by computer system/server 12, and include both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by at least one data media interface. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 (by way of example, and not limitation), as well as an operating system, at least one application program, other program modules, and program data. Each of the operating systems, at least one application program, other program modules, and program data or some combination thereof, may include an implementation of a networking environment. Program modules 42 generally carry out the functions and/or methodologies of embodiments of the invention as described herein.

Computer system/server 12 may also communicate with at least one external device 14 such as a keyboard, a pointing device, a display 24, etc.; at least one device that enables a user to interact with computer system/server 12; and/or any devices (e.g., network card, modem, etc.) that enable computer system/server 12 to communicate with at least one other computing device. Such communication can occur via I/O interfaces 22. Still yet, computer system/server 12 can communicate with at least one network such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

It should be noted that aspects of the invention may be embodied as a system, method or computer program product. Accordingly, aspects of the invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the invention may take the form of a computer program product embodied in at least one computer readable medium having computer readable program code embodied thereon.

Any combination of one or more computer readable media may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having at least one wire, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store, a program for use by, or in connection with, an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the invention may be written in any combination of at least one programming language, including an object oriented programming language such as Java®, Smalltalk, C++ or the like and conventional procedural programming languages, such as the "C" programming language or similar programming languages. The program code may execute entirely on the user's computer (device), partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described herein with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture. Such an article of manufacture can include instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

What is claimed is:

1. A method of cognitive alarm management, said method comprising:
   utilizing at least one processor to execute computer code configured to perform the steps of:
   receiving, from a plurality of sensors of a power grid, a plurality of sensor measurements;
   transforming the plurality of sensor measurements into a state estimation of the power grid, the state estimation of the power grid including two or more alarms;
   determining rankings of the two or more alarms, wherein the determining comprises identifying a historical alarm condition having a similarity to the state estimation of the power grid and ranking the two or more alarms based upon control actions resulting in a successful resolution of the historical alarm condition, wherein the determining comprises utilizing an alarm relationship graph that identifies a dynamic relationship between alarms and identifies dependencies between alarms;
   simulating power flow resulting from resolution of the two or more alarms in rank-order, according to the rankings of the two or more alarms;
   determining a final ranking of the two or more alarms based on said simulating;
   wherein the final ranking of the two or more alarms identifies a causal alarm to be prioritized for resolution, wherein the causal alarm comprises an alarm that when resolved resolves at least one other of the two or more alarms;

generating a resolution plan based upon the final ranking, wherein the resolution plan comprises an order for resolving the two or more alarms and wherein the order prioritizes the causal alarm and results in the two or more alarms being resolved using a least number of control actions; and causing execution of the least number of control actions in the order for resolving the two or more alarms to bring the power grid back to a normal and secure state.

2. The method according to claim 1, wherein:
the plurality of sensor measurements comprise voltage and current measurements; and
said transforming comprises converting the plurality of sensor measurements into predefined bands of measurements corresponding to alarm conditions.

3. The method of claim 1, wherein said determining of rankings comprises creating two or more rankings of alarms based on at least one of: severity index calculations and graph analysis.

4. The method of claim 3, wherein the severity index calculations are used to rank alarms according to calculated severity.

5. The method of claim 3, wherein the graph analysis is used to rank alarms according to power grid topology.

6. The method of claim 1, wherein said simulating comprises estimating an effect on the power grid of resolving alarms according to different rankings contained in the rankings of the two or more alarms.

7. The method of claim 6, wherein said determining of a final ranking comprises identifying a ranking among the rankings of the two or more alarms that resolves the most alarms automatically.

8. The method of claim 7, wherein the final ranking of the two or more alarms includes the causal alarm to be prioritized for resolution as a highest ranked alarm.

9. The method of claim 1, comprising determining whether the state estimation of the power grid is similar to at least one of: a previous state of the same power grid and a previous state of a different power grid.

10. The method of claim 9, comprising, in response to determining whether the state estimation of the power grid is similar to at least one of a previous state of the same power grid and a previous state of a different power grid, providing a ranking of the two or more alarms based on a similarity calculation.

11. A computer program product for cognitive alarm management, said computer program product comprising:
a non-transitory computer readable storage medium having computer readable program code embodied therewith, the computer readable program code comprising:
computer readable program code configured to receive, from a plurality of sensors of a power grid, a plurality of sensor measurements;
computer readable program code configured to transform the plurality of sensor measurements into a state estimation of the power grid, the state estimation of the power grid including two or more alarms;
computer readable program code configured to determine rankings of the two or more alarms, wherein to determine comprises identifying a historical alarm condition having a similarity to the state estimation of the power grid and ranking the two or more alarms based upon control actions resulting in a successful resolution of the historical alarm condition, wherein the determining comprises utilizing an alarm relationship graph that identifies a dynamic relationship between alarms and identifies dependencies between alarms;
computer readable program code configured to simulate power flow resulting from resolution of the two or more alarms in rank-order according to the rankings of the two or more alarms;
computer readable program code configured to determine a final ranking of the two or more alarms based on the simulating;
wherein the final ranking of the two or more alarms identifies a causal alarm to be prioritized for resolution, wherein the causal alarm comprises an alarm that when resolved resolves at least one other of the two or more alarms;
computer readable program configured to generate a resolution plan based upon the final ranking, wherein the resolution plan comprises an order for resolving the two or more alarms and wherein the order prioritizes the causal alarm and results in the two or more alarms being resolved using a least number of control actions; and
computer readable program code configured to cause execution of the least number of control actions in the order for resolving the two or more alarms to bring the power grid back to a normal and secure state.

12. The computer program product according to claim 11, wherein:
the plurality of sensor measurements comprise voltage and current measurements, and
said computer readable program code is configured to convert the plurality of sensor measurements into predefined bands of measurements corresponding to alarm conditions.

13. The computer program product of claim 11, wherein said computer readable program code is configured to create two or more rankings of alarms based on at least one of severity index calculations and graph analysis.

14. The computer program product of claim 13, wherein the severity index calculations are used to rank alarms according to calculated severity.

15. The computer program product of claim 13, wherein the graph analysis is used to rank alarms according to power grid topology.

16. The computer program product of claim 11, wherein said computer readable program code is configured to estimate an effect on the power grid of resolving alarms according to different rankings contained in the rankings of the two or more alarms.

17. The computer program product of claim 16, wherein to determine a final ranking comprises identifying a ranking among the rankings of the two or more alarms that resolves the most alarms automatically.

18. The computer program product of claim 17, wherein the final ranking of the two or more alarms includes the causal alarm to be prioritized for resolution as a highest ranked alarm.

19. An apparatus for cognitive alarm management, said apparatus comprising:
at least one processor; and
a computer readable storage medium having computer readable program code embodied therewith and executable by the at least one processor, the computer readable program code comprising:
computer readable program code configured to receive, from a plurality of sensors of a power grid, a plurality of sensor measurements;

computer readable program code configured to transform the plurality of sensor measurements into a state estimation of the power grid, the state estimation of the power grid including two or more alarms;

computer readable program code configured to determine rankings of the two or more alarms, wherein to determine comprises identifying a historical alarm condition having a similarity to the state estimation of the power grid and ranking the two or more alarms based upon control actions resulting in a successful resolution of the historical alarm condition, wherein the determining comprises utilizing an alarm relationship graph that identifies a dynamic relationship between alarms and identifies dependencies between alarms;

computer readable program code configured to simulate power flow resulting from resolution of the two or more alarms in rank-order according to the rankings of the two or more alarms;

computer readable program code configured to determine a final ranking of the two or more alarms based on the simulating;

wherein the final ranking of the two or more alarms identifies a causal alarm to be prioritized for resolution, wherein the causal alarm comprises an alarm that when resolved resolves at least one other of the two or more alarms;

computer readable program configured to generate a resolution plan based upon the final ranking, wherein the resolution plan comprises an order for resolving the two or more alarms and wherein the order prioritizes the causal alarm and results in the two or more alarms being resolved using a least number of control action; and computer readable program code configured to cause execution of the least number of control actions in the order for resolving the two or more alarms to bring the power grid back to a normal and secure state.

20. A method comprising:

utilizing at least one processor to execute computer code configured to perform the steps of:

receiving a plurality of power grid sensor measurements;

transforming the power grid sensor measurements into an estimation of two or more alarms;

ranking the two or more alarms based on at least one of severity index calculations and graph analysis, wherein the ranking comprises identifying a historical alarm condition having a similarity to the estimation of the two or more alarms and ranking the two or more alarms based upon control actions resulting in a successful resolution of the historical alarm condition, wherein the ranking comprises utilizing an alarm relationship graph that identifies a dynamic relationship between alarms and identifies dependencies between alarms;

conducting a power flow simulation relating to resolution of the two or more alarms in rank-order, based on the ranking the two or more alarms;

thereupon identifying a causal alarm, comprising an alarm that when resolved resolves at least one other of the two or more alarms, to be prioritized for resolution, wherein the identifying a causal alarm comprises determining a final ranking of the two or more alarms based upon the power flow simulation;

generating a resolution plan based upon the final ranking, wherein the resolution plan comprises an order for resolving the two or more alarms and wherein the order prioritizes the causal alarm and results in the two or more alarms being resolved using a least number of control actions; and executing the least number of control actions in the order for resolving the two or more alarms to bring the power grid back to a normal and secure state.

* * * * *